(12) United States Patent
Sugiura et al.

(10) Patent No.: US 11,198,935 B2
(45) Date of Patent: Dec. 14, 2021

(54) HEATING PART, SUBSTRATE PROCESSING APPARATUS, AND METHOD OF MANUFACTURING SEMICONDUCTOR DEVICE

(71) Applicants: HITACHI KOKUSAI ELECTRIC INC., Tokyo (JP); TOKYO TECHNOLOGICAL LABO CO., LTD., Kawasaki (JP)

(72) Inventors: Shinobu Sugiura, Toyama (JP); Yosuke Kuwata, Toyama (JP); Tomoyasu Miyashita, Toyama (JP); Atsushi Umekawa, Toyama (JP); Kazuhiro Kimura, Toyama (JP); Akihiko Hiratsuka, Kawasaki (JP); Kaoru Kataoka, Kawasaki (JP); Ryosuke Arai, Kawasaki (JP)

(73) Assignee: KOKUSAI ELECTRIC CORPORATION, Tokyo (JP)

( * ) Notice: Subject to any disclaimer, the term of this patent is extended or adjusted under 35 U.S.C. 154(b) by 441 days.

(21) Appl. No.: 15/272,798

(22) Filed: Sep. 22, 2016

(65) Prior Publication Data
US 2017/0107620 A1    Apr. 20, 2017

(30) Foreign Application Priority Data

Oct. 16, 2015 (JP) .............................. JP2015-204503
Sep. 8, 2016 (JP) .............................. JP2016-175856

(51) Int. Cl.
*C23C 16/44* (2006.01)
*C23C 16/455* (2006.01)
*H01L 21/67* (2006.01)

(52) U.S. Cl.
CPC .... *C23C 16/4401* (2013.01); *C23C 16/45525* (2013.01); *H01L 21/67017* (2013.01); *H01L 21/67109* (2013.01); *H01L 21/67248* (2013.01)

(58) Field of Classification Search
CPC .................................. F16L 53/38; H05B 3/58
(Continued)

(56) References Cited

U.S. PATENT DOCUMENTS 4,401,243 A * 8/1983 Diederich ............ B22D 41/505
                                                    222/591
4,815,769 A * 3/1989 Hopperdietzel .......... B05B 1/24
                                                    285/41
(Continued)

FOREIGN PATENT DOCUMENTS

JP    54-046581 A    4/1979
JP    61-116282 U    7/1986
(Continued)

OTHER PUBLICATIONS

Korean Office Action dated Dec. 20, 2017 for the Korean Application No. 10-2016-0122031.
(Continued)

*Primary Examiner* — Charlee J. C. Bennett
(74) *Attorney, Agent, or Firm* — Volpe Koenig

(57) ABSTRACT

A heating part of covering and heating a gas pipe includes: a thermal insulation portion disposed outside a heat generation body; an enclosure configured to enclose the thermal insulation portion and the heat generation body; a fastening part installed outside the enclose and configured to fasten one end portion and the other end portion of the enclosure in a state in which the one end portion and the other end portion of the enclosure adjoin each other; and a temperature sensing part disposed at the side of the gas pipe with respect
(Continued)

to the enclosure at a position facing a surface of the gas pipe and formed in a plate shape with a major surface thereof oriented toward the gas pipe.

24 Claims, 11 Drawing Sheets

(58) Field of Classification Search
USPC .......... 156/912–913, 345.1–345.55; 118/725
See application file for complete search history.

(56) References Cited

U.S. PATENT DOCUMENTS

| | | | | | |
|---|---|---|---|---|---|
| 5,197,595 | A | | 3/1993 | Coultas | |
| 5,428,706 | A | * | 6/1995 | Lequeux | F16L 53/38 392/472 |
| 5,883,363 | A | * | 3/1999 | Motoyoshi | H05B 3/36 219/529 |
| 6,451,692 | B1 | * | 9/2002 | Derderian | C23C 16/34 427/255.391 |
| 6,516,142 | B2 | * | 2/2003 | Grant | F24H 1/102 392/451 |
| 6,727,481 | B1 | * | 4/2004 | Wilds | F16L 53/008 219/549 |
| 6,894,254 | B2 | * | 5/2005 | Hauschulz | G05D 23/1934 219/483 |
| 7,266,293 | B1 | * | 9/2007 | Dundas | F16L 11/127 392/465 |
| 7,752,909 | B2 | | 7/2010 | Kamiunten et al. | |
| 9,018,111 | B2 | * | 4/2015 | Milligan | H01L 21/67069 438/798 |
| 9,222,699 | B1 | * | 12/2015 | Hendrickson | F02M 31/125 |
| 9,380,649 | B2 | | 6/2016 | Iida et al. | |
| 10,021,739 | B2 | * | 7/2018 | Kiernan | H05B 3/34 |
| 2005/0067038 | A1 | * | 3/2005 | Kobayashi | H05B 3/56 138/149 |
| 2006/0238986 | A1 | * | 10/2006 | Sasaki | F16L 53/38 361/717 |
| 2006/0289471 | A1 | * | 12/2006 | Sasaki | H05B 3/58 219/535 |
| 2007/0045275 | A1 | * | 3/2007 | Steinhauser | H05B 3/56 219/228 |
| 2008/0047339 | A1 | * | 2/2008 | Hasebe | G01F 1/684 73/204.17 |
| 2008/0187652 | A1 | * | 8/2008 | Nakajima | H01L 21/67109 427/96.8 |
| 2010/0209085 | A1 | * | 8/2010 | Ellis | H05B 3/145 392/468 |
| 2011/0220023 | A1 | * | 9/2011 | Lee | F16L 23/006 118/715 |
| 2012/0125913 | A1 | * | 5/2012 | Song | H05B 3/34 219/546 |
| 2013/0062338 | A1 | * | 3/2013 | Iida | H05B 3/02 219/548 |
| 2013/0104988 | A1 | * | 5/2013 | Yednak, III | F16L 53/38 137/1 |
| 2013/0209949 | A1 | | 8/2013 | Saito et al. | |
| 2013/0248013 | A1 | * | 9/2013 | Chakkalakal | F16L 59/029 137/334 |
| 2014/0029925 | A1 | * | 1/2014 | Smith | H05B 3/02 392/468 |
| 2016/0146393 | A1 | * | 5/2016 | Kim | H05B 3/58 219/535 |
| 2016/0278164 | A1 | * | 9/2016 | Iida | H05B 3/34 |
| 2018/0058622 | A1 | * | 3/2018 | LaCanfora | B32B 25/20 |
| 2018/0120822 | A1 | * | 5/2018 | Asai | G05B 19/4184 |
| 2018/0312679 | A1 | * | 11/2018 | Yodogawa | B32B 5/18 |

FOREIGN PATENT DOCUMENTS

| | | | |
|---|---|---|---|
| JP | 01-145537 | A | 6/1989 |
| JP | 02-079386 | A | 3/1990 |
| JP | 7305796 | A | 11/1995 |
| JP | 09-229285 | A | 9/1997 |
| JP | 09-232295 | A | 9/1997 |
| JP | 10-141587 | A | 5/1998 |
| JP | 3044438 | B2 | 5/2000 |
| JP | 2002-295783 | A | 10/2002 |
| JP | 2002-352941 | A | 12/2002 |
| JP | 2003-294192 | A | 10/2003 |
| JP | 2008-164115 | A | 7/2008 |
| JP | 2009-009835 | A | 1/2009 |
| JP | 2009-176942 | A | 8/2009 |
| JP | 2009-230454 | A | 10/2009 |
| JP | 2010-276184 | A | 12/2010 |
| JP | 2011-061002 | A | 3/2011 |
| JP | 2012-088171 | A | 5/2012 |
| JP | 2013-500451 | A | 1/2013 |
| JP | 2013-205310 | A | 10/2013 |
| JP | 2014-085185 | A | 5/2014 |
| KR | 10-2005-0031904 | A | 4/2005 |
| KR | 10-2007-0049188 | A | 5/2007 |
| KR | 100955861 | B1 | 5/2010 |
| KR | 20120137765 | A | 12/2012 |
| KR | 10-2013-0006463 | A | 1/2013 |
| KR | 10-2013-0092444 | A | 8/2013 |

OTHER PUBLICATIONS

Chinese Office Action dated Nov. 16, 2018 for the Chinese Patent Application No. 201610844366.6.
Chinese Office Action dated Jul. 31, 2019 for the Chinese Patent Application No. 201610844366.6.
Japanese Office Action dated May 28, 2019 for the Japanese Patent Application No. 2016-175856.
Korean Petition for Patent Cancellation dated Sep. 19, 2019 for the Korean Patent Application No. 10-2016-0122031.
Korean Office Action dated Mar. 2, 2020 for the Korean Patent Application No. 10-2016-0122031.
Toyonaka Hot Laboratory Co., Ltd., Products Guide general catalog, 3rd edition, Jan. 2014.
Heating mantle, Watty Co. Ltd., Internet Archive Wayback Machine, https://web.archive.org/web/20150809044421/www.watty.co.jp/heater/mantle.html, Aug. 9, 2015.
Mantle heater / jacket heater, Tokyo Technological Labo Co. Ltd., Internet Archive Wayback Machine, https://web. archive.org/web/20151002234054/http://tt-labo.co.jp/seihin01/seihin01_01.html, Oct. 2, 2015.
Product information jacket heater, Ariake Material Co., Ltd., Internet Archive Wayback Machine, https://web.archive.org/web/20140528104603/http //www.ariake-materials.co.jp/j/products/jacket.html, May 28, 2014.
Clean room mantle heater, Tokyo Technical Research Institute, Internet Archive Wayback Machine, https://web. archive.org/web/20150702131828/http://tt-labo.co.jp/seihin01/seihin01_03.html, Jul. 2, 2015.
Measurement technology for beginners, vol. 8, No. 4, pp. 276-280, Oct. 1994.
Mishiba, Bellows for Vacuum Applications, Valqua Bellows Industries, Ltd., Jul. 11, 1983.
Japanese Notice of Reason for Cancellation dated Jul. 12, 2021 for Japanese Patent Application No. 2016-175856.

* cited by examiner

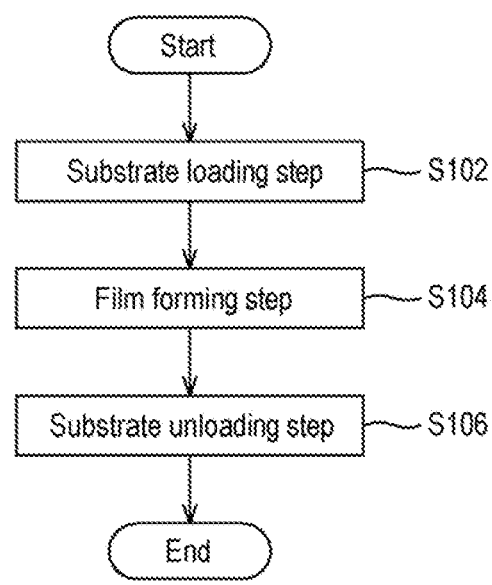

HEATING PART, SUBSTRATE PROCESSING APPARATUS, AND METHOD OF MANUFACTURING SEMICONDUCTOR DEVICE

CROSS-REFERENCE TO RELATED APPLICATION

This application is based upon and claims the benefit of priority from Japanese Patent Application Nos. 2015-204503, filed on Oct. 16, 2015, and 2016-175856, filed on Sep. 8, 2016, the entire contents of which are incorporated herein by reference.

TECHNICAL FIELD

The present disclosure relates to a heating part, a substrate processing apparatus and a method of manufacturing a semiconductor device.

BACKGROUND

A semiconductor manufacturing apparatus requires supplying a required gas and exhausting the gas. Heating parts (hereinafter also referred to as "pipe heaters") for heating a gas supply pipe and a gas exhaust pipe are provided in the gas supply pipe and the gas exhaust pipe. The heating parts are configured to maintain a heating state, thereby preventing reliquefaction and adhesion of by-products, which may otherwise be caused by the cooling of a gas flowing through the gas supply pipe and the gas exhaust pipe.

In the related art, a general-purpose tape heater or ribbon heater is installed as a means for heating a target object such as an interior of a substrate processing apparatus, additional facilities or pipes connected thereto. An insulation body and a thermal insulation material are installed on the outer periphery of the heater. However, variations in the installation state are generated depending on the workers, which deteriorates temperature uniformity. The term "gas pipe" used herein is a generic name for target pipes to which pipe heaters are installed.

SUMMARY

Some embodiments of the present disclosure provide a configuration capable of reducing temperature unevenness in a gas pipe heated by a heater.

According to one embodiment of the present disclosure, there is provided a configuration for covering and heating a surface of a gas pipe, including: a thermal insulation portion disposed outside a heat generation body; an enclosure configured to enclose the thermal insulation portion and the heat generation body; a fastening part installed outside the enclosure and configured to fasten one end portion and the other end portion of the enclosure in a state in which the one end portion and the other end portion of the enclosure adjoin each other; and a temperature sensing part disposed at the side of the gas pipe with respect to the enclosure at a position facing the surface of the gas pipe and formed in a plate shape with a major surface thereof oriented toward the gas pipe.

BRIEF DESCRIPTION OF THE DRAWINGS

FIG. 3 is a flowchart illustrating a substrate processing process which is used in the substrate processing apparatus according to an embodiment of the present disclosure.

Figure 1:
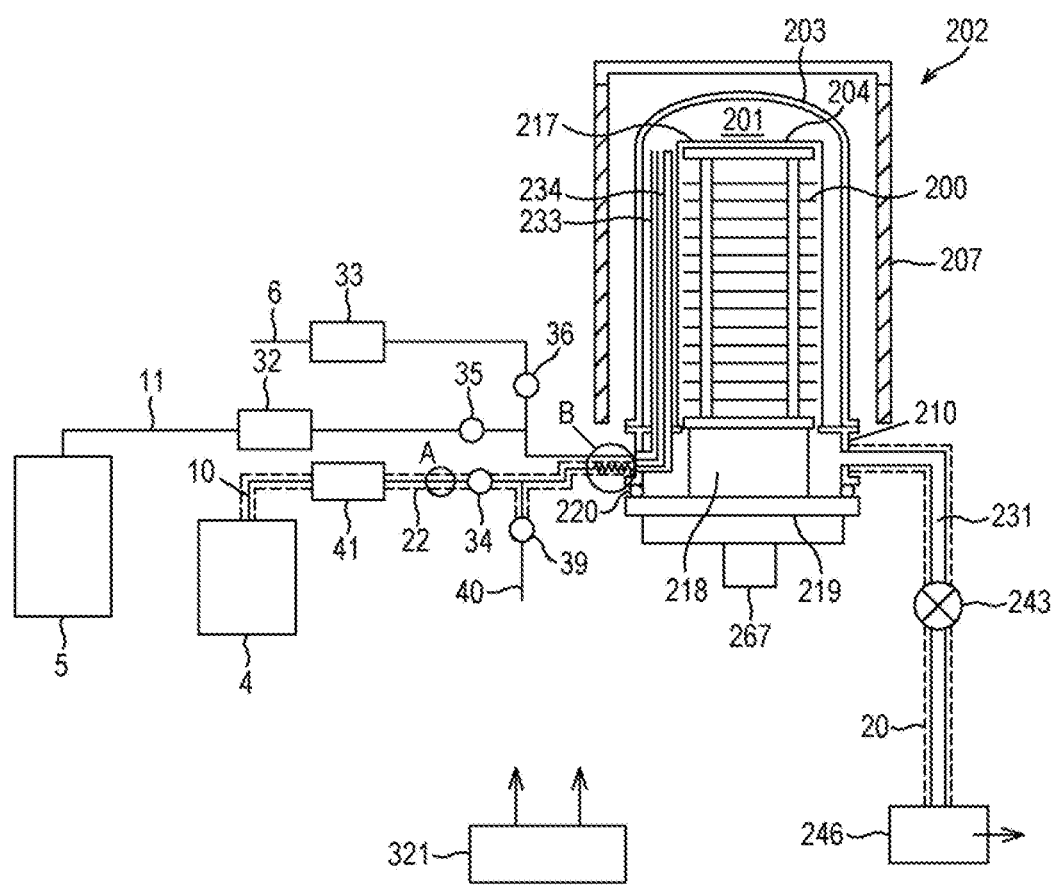
FIG. 1 is a schematic vertical sectional view for explaining a process chamber which is used in a substrate processing apparatus according to an embodiment of the present disclosure.

DETAILED DESCRIPTION (1) Configuration of Substrate Processing Apparatus

Hereinafter, embodiments of the present disclosure will be described with reference to the drawings. In the following descriptions, there may be a case where the same components are designated by like reference numerals with the repeated descriptions thereof omitted. Furthermore, there may be a case where, for the sake of clear description, the width, thickness, shape and the like are illustrated more schematically than actual ones in the drawings. However, this is nothing more than one example and is not intended to limit the interpretation of the present disclosure.

As used herein, the term "wafer" may refer to "a wafer itself" or "a laminated body of a wafer and a predetermined layer or film formed on a surface of the wafer." In addition, as used herein, the phrase "a surface of a wafer" may refer to "a surface of a wafer itself" or "a surface of a predetermined layer or film formed on a wafer." Also, as used herein, the expression "a predetermined layer is formed on a wafer" may mean that "a predetermined layer is directly formed on a surface of a wafer itself" or that "a predetermined layer is formed on a layer or the like formed on a wafer." In addition, the term "substrate" used herein may be synonymous with the term "wafer."

(Processing Furnace)

As illustrated in FIG. 1, a reaction rube 203 as a process vessel for processing wafers 200 as substrates is installed inside a heater 207 which is a heating means. An inlet flange 210 is installed in a lower end portion of the reaction tube 203. The inlet flange 210 is air-tightly closed by a seal cap 219 as a lid through an O-ring 220 which is a seal member. A process chamber 201 is formed of at least the reaction tube 203, an inner tube 204, the inlet flange 210 and the seal cap 219. The inner tube 204 is mounted on the inlet flange 210. A boat 217 as a substrate holding part is installed on the seal cap 219 through a quartz cap 218. The quartz cap 218 and the boat 217 are loaded into and unloaded from the process chamber 201. A plurality of wafers 200 to be batch-processed is horizontally mounted on the boat 217 in multiple stages. The heater 207 is configured to heat the wafers 200, which are accommodated in the process chamber 201, to a predetermined temperature.

A gas pipe 10 configured to supply a first process gas (raw material gas) and a gas pipe 11 configured to supply a second process gas (reaction gas) are in communication with the process chamber 201. In the gas pipe 10, a gas supply part 4 configured to supply a first raw material gas as the first process gas, a flow rate controller (mass flow controller MFC) 41 configured to control a flow rate of the first raw material gas supplied from the gas supply part 4, and a valve 34 configured to open and close a flow path of the first raw material gas, are installed sequentially from the upstream side of the gas pipe 10. The first process gas is supplied from the gas pipe 10 into the process chamber 201 via the gas supply part 4, the MFC 41 and the valve 34 and via a nozzle 234 installed within the process chamber 201. A combination of the gas pipe 10, the flow rate controller 41, the valve 34 and the nozzle 234 constitutes a first gas supply system. In the gas pipe 11, a gas supply part 5 configured to supply a first reaction gas as the second process gas, a flow rate controller 32 configured to control a flow rate of the first reaction gas supplied from the gas supply part 5, and a valve 35 configured to open and close a flow path of the first reaction gas, are installed sequentially from the upstream side of the gas pipe 11. The second process as is supplied from the gas pipe 11 into the process chamber 201 via the gas supply part 5, the flow rate controller 32 and the valve 35 and via a nozzle 233 installed within the process chamber 201. A combination of the gas pipe 11, the MFC 32, the valve 35 and the nozzle 233 constitutes a second gas supply system. A gas pipe heater 22 configured to heat the gas pipe 10 is installed around the gas pipe 10 extending from the gas supply part 4 to the process chamber 201. A jacket heater 310 (hereinafter also referred to as "first pipe heater") serving as a heating part according to an embodiment is used as the gas pipe heater 22. A gas pipe 40 configured to supply an inert gas is connected to the gas pipe 10 at the downstream side of the valve 34 via a valve 39. In the present embodiment, a gas pipe heater is not installed in the second gas supply system. However, depending On the second process gas, the jacket heater 310 according to the present embodiment may be appropriately installed in the second gas supply system.

The gas pipe 10 includes a plurality of straight pipe portions formed in a liner shape and a plurality of bent portions configured to interconnect the straight pipe portions. The portion of the gas pipe 10 existing between the straight portions of the gas pipe 10 and the inlet flange 210 is configured as a seamless pipe (hereinafter also referred to as "flexible pipe") formed in a bellows shape. The gas pipe 10 is connected to the nozzle 234 via the inlet flange 210. The gas pipe 10 is made of a metallic material such as SUS or the like. A portion of the gas pipe 10 indicated by A in FIG. 1 is formed of a straight pipe portion. A portion of the gas pipe 10 indicated by B in FIG. 1 is formed of a flexible pipe. In the present disclosure, each of the straight pipe portion, the bent portion and the flexible pipe is a portion of the as pipe 10 and is a gas pipe in which the pipe heater (the heating part 310 in the present embodiment) is installed.

The process chamber 201 is coupled to a vacuum pump 246 via an APC valve 243 by an exhaust pipe 231 which exhausts a gas. A combination of the exhaust pipe 231, the APC valve 243 and the vacuum pump 246 constitutes a gas exhaust system. An exhaust pipe heater 20 (hereinafter also referred to as "second pipe heater") configured to heat the exhaust pipe 231 is installed around the exhaust pipe 231 extending from the reaction tube 203 to the vacuum pump 246. The jacket heater 310 according to an embodiment may be used as the exhaust pipe heater 20. In the present disclosure, the exhaust pipe 231 is a gas pipe in which the pipe heater (the exhaust pipe heater 20 in the present embodiment) is installed.

A nozzle 234 is installed so as to vertically extend from the lower portion of the reaction tube 203 toward the upper portion thereof. A plurality of vas supply holes through which a raw material gas is supplied is formed in the nozzle 234. The gas supply holes are opened in positions between the wafers 200 which face the gas supply holes through the inner tube 204. Thus, the process gas is supplied to the wafers 200. Similar to the nozzle 234, the nozzle 233 is installed in a position spaced apart from the position of the nozzle 234 toward the inner circumference of the reaction tube 203. A plurality of vas supply holes is formed in the nozzle 233. As described above, the nozzle 234 communicates with the gas pipe 10 and supplies a first process gas and an inert gas into the process chamber 201. The inert vas is supplied from the has pipe 40 connected to the gas pipe 10. Furthermore, as described above, the nozzle 233 communicates with the gas pipe 11 and supplies to second process gas and an inert gas into the process chamber 201. The inert gas is supplied from the gas pipe 6 connected to the gas pipe 11, Film formation is performed by alternately supplying the process gases from the nozzles 234 and 233 into the process chamber 201.

The boat 217 configured to hold the plurality of wafers 200 in multiple stages at regular intervals is installed within the inner tube 204. The boat 217 can be loaded into and unloaded from the process chamber 201 by a boat elevator used as a boat elevator mechanism, A rotating mechanism 267 used as a boat rotating mechanism, which is a rotating means for rotating the boat 217, is installed to improve the processing uniformity. The boat 217 held on the quartz cap 218 is rotated by rotating the rotating mechanism 267.

(Controller)

Figure 2:
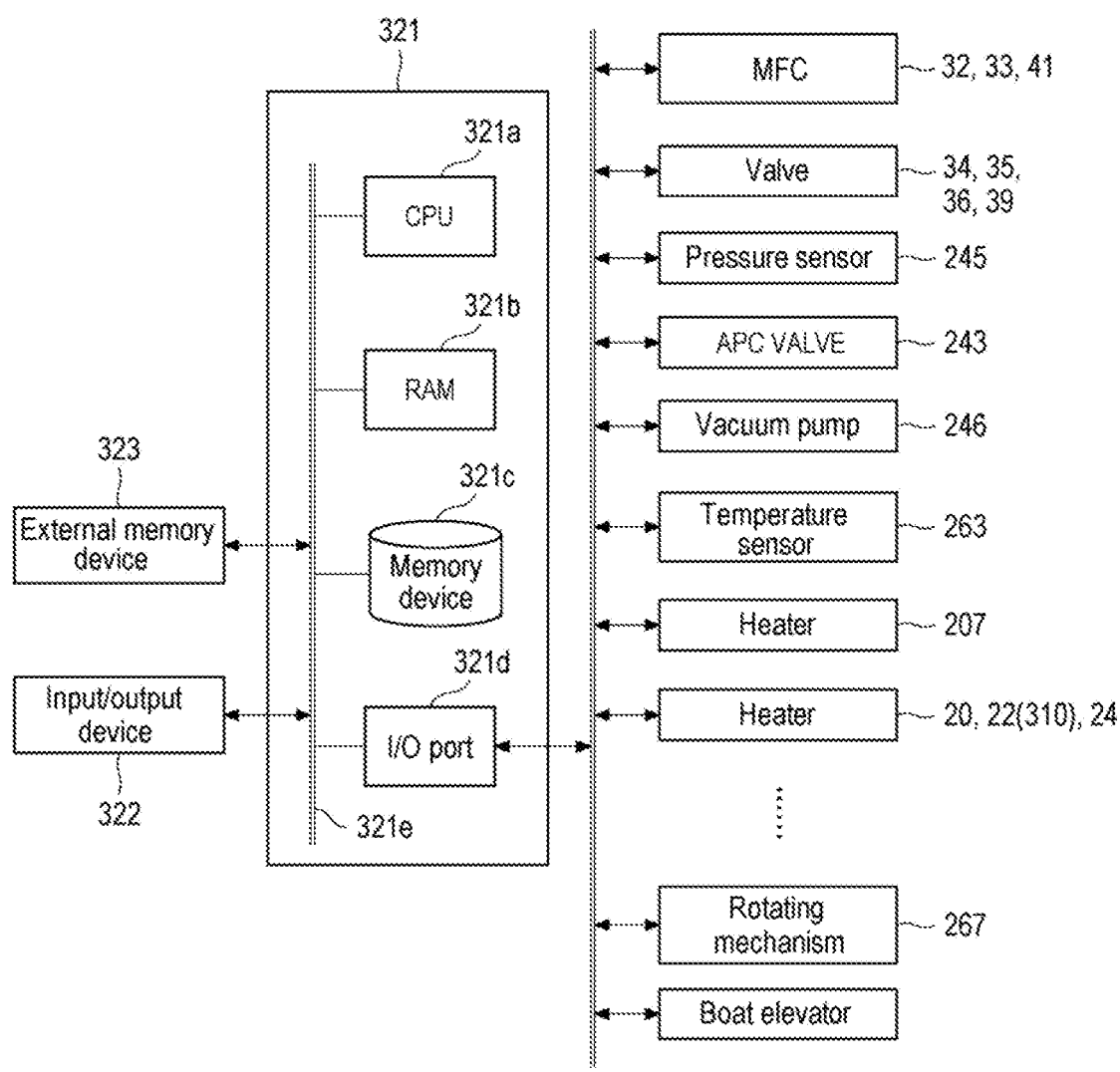
FIG. 2 is a block diagram for explaining a structure of a controller which is used in the substrate processing apparatus according to an embodiment of the present disclosure.

A controller will be described with reference to FIG. 2.

A controller 321 as a control part (control means) is configured as a computer including a central processing unit (CPU) 321a, a random access memory (RAM) 321b, a memory device 321c, and an I/O port 321d. The RAM 321b, the memory device 321c and the I/O port 321d are configured to exchange data with the CPU 321a via an internal bus 321e. An input/output device 322 formed of, e.g., a touch panel or the like, is connected to the controller 321.

The memory device 321c is configured by, for example, a flash memory, a hard disk drive (HDD), or the like. A control program for controlling operations of a substrate processing apparatus and a process recipe, in which a sequence or condition for processing a substrate to be described later is written, are readably stored in the memory device 321c. The process recipe is combined so as to cause the controller 321 to execute each sequence in the substrate processing procedure, which will be described later, to obtain a predetermined result. Herein process recipes and control programs are collectively simply referred to as programs. The process recipes are also simply referred to s recipes. As used herein, the term "programs" may be intended to include process recipes only, control programs only, or both thereof. The RAM 321b is configured as a memory area (work area) in which programs and data read by the CPU 321a are temporarily stored.

The I/O port 321d connected to the flow rate controllers 32 and 33, 41, the valves 34, 35, 36 and 39, the pressure sensor 245, the APC valve 243, the vacuum pump 246, the heater 207, the gas pipe heater 22 (310) the exhaust pipe heater 20 (310), the temperature sensor 263, the rotating mechanism 267, the boat elevator, and the like.

The CPU 321a is configured to read the control program from the memory device 321c and execute the control program. The CPU 321a is also configured to read the process recipe from the memory device 321c according to an input of an operation command from the input/output device 322. The CPU 321a is configured to, according to the content of the process recipe thus read, control the flow rate adjusting operations of various kinds of gases performed by the flow rate controllers 32, 33 and 41, the opening/closing operations of the valves 34, 35, 36 and 39, the opening/closing operation of the APC valve 243, the pressure regulating operation performed by the APC valve 243 based on the pressure sensor 245, the temperature adjusting operation performed by the beater 207 based on the temperature sensor 263, the start/stop operation of the vacuum pump 246, the operation of rotating the boat 217 with the rotating mechanism 267 and adjusting the rotational speed of the boat 217, the operation of moving the boat 217 up and down with the boat elevator, and the like.

The controller 321 may be configured by installing, into the computer, the aforementioned program stored in an external memory device 323 (e.g., a magnetic tape, a magnetic disc such as a flexible disc or a hard disc, an optical disc such as a CD or a DVD, a magneto-optical disc such as an MO or the like, or a semiconductor memory such as a USB memory or a memory card). The memory device 321c or the external memory device 323 is configured as a computer-readable recording medium. The program may be supplied to the computer using a communication means such as the Internet or a dedicated line without having to use the external memory device 323.

(2) Substrate Processing Process

Next, descriptions will be made on the outline of a substrate processing process which processes substrates using a substrate processing apparatus as a semiconductor manufacturing apparatus. The substrate processing process is, for example, one process for manufacturing a semiconductor device. In the following descriptions, the operations and processes of the respective parts constituting the substrate processing apparatus are controlled by the controller 321. In the present embodiment, descriptions will be made on an example in which a film is formed on a wafer 200 as a substrate by alternately supplying a first process gas (raw material gas) and a second process gas (reaction gas) to the wafer 200. Hereinafter, descriptions will be made on an example in which a SiN (silicon nitride) film as a thin film is formed on a wafer 200 using a hexachlorodisilane ($Si_2Cl_6$, abbreviation: HCDS) gas as a raw material gas and using an ammonia ($NH_3$) gas as a reaction gas. A predetermined film may be formed in advance on a wafer 200. A predetermined pattern may be formed in advance on a wafer 200 or a predetermined film.

The substrate processing process will now be described with reference to FIG. 3.

(Substrate Loading Step S102)

First, a substrate loading step S102 is performed by charging the wafers 200 into the boat 217 and loading the boat 217 into the process chamber 201.

(Film Forming Step S104)

Thereafter, a film forming step S104 is performed to form a film on each of the wafers 200. At the film forming step S104, the following four steps are sequentially performed. During steps S1 to S4, the wafers 200 are heated to a predetermined temperature by the heater 207. The as pipe 10 is heated to a first designated temperature by the gas pipe heater 22. The first designated temperature is appropriately set depending on the raw material gas. In the present embodiment, the HCDS gas is used as the raw material gas. Thus, during the film forming step S104 to be described later, the gas pipe 10 is heated to, for example, 180 degrees C. or higher as the first designated temperature. In the present embodiment, descriptions will be made on a case where the exhaust pipe heater 20 is also operated at least during the film forming step S104 to be described later.

[Step S1]

At step S1, the HCDS gas is supplied. Initially, the valve 34 installed in the gas pipe 10 and the APC valve 243 installed in the exhaust pipe 231 are opened. The HCDS gas, which is supplied from the gas supply part 4 and flow-rate-adjusted by the flow rate controller 41, is allowed to flow through the gas pipe 10 and is supplied from the gas supply holes of the nozzle 234 into the process chamber 201. The HCDS gas is exhausted from the exhaust pipe 231. At this time, the as pipe heater 22 heats the gas pipe 10 and the exhaust pipe heater 20 heats the exhaust pipe 231. Furthermore, at this time, an internal pressure of the process chamber 201 is maintained at a predetermined pressure.

In this way, a silicon-containing layer is formed on each of the wafers 200.

[Step S2]

At step S2, the valve 34 of the gas pipe 10 is closed to stop the supply of the HCDS gas. While keeping the APC valve 243 of the exhaust pipe 231 opened, the interior of the process chamber 201 is exhausted by the vacuum pump 246, thereby removing a residual gas from the interior of the process chamber 201. Furthermore, the valve 39 installed in the gas pipe 40 is opened. An inert gas such as an $N_2$ gas or the like is supplied from the gas pipe 40 into the process chamber 201 to purge the interior of the process chamber 201, thereby discharging a residual gas existing within the process chamber 201 outside of the process chamber 201. At this time, the gas pipe heater 22 heats the gas pipe 10 and the exhaust pipe heater 20 heats the exhaust pipe 231. The valve 36 installed in the gas pipe 6 is opened. An inert gas such as all $N_2$ gas or the like, the flow rate of which is adjusted by the flow rate controller 33, is supplied from the gas pipe 6 into the process chamber 201.

[Step S3]

At step S3, an NH$_3$ gas is supplied. The valve 35 installed in the gas pipe 11 and the APC valve 243 installed in the exhaust pipe 231 are opened. The NH$_3$ gas, which is supplied from the gas supply part 5 and flow-rate-adjusted by the flow rate controller 32, is allowed to flow through the gas pipe 11 and is supplied from the gas supply holes of the nozzle 233 into the process chamber 201. The NH$_3$ gas is exhausted from the exhaust pipe 231. At this time, the exhaust pipe heater 20 heats the exhaust pipe 231. Furthermore, the internal pressure of the process chamber 201 is regulated at a predetermined pressure. Due to the supply of the NH$_3$ gas, the silicon-containing layer formed on the surface of each of the wafer 200 at step S1 makes reaction with the NH$_3$ gas. Thus, a SiN layer is formed on each of the wafers 200.

[Step S4]

At step S4, the interior of the process chamber 201 is purged again by an inert gas. The valve 35 of the gas pipe 11 is closed to stop the supply of the NH$_3$ gas. While keeping the APC valve 243 of the exhaust pipe 231 opened, the interior of the process chamber 201 is exhausted by the vacuum pump 246, thereby removing a residual gas from the interior of the process chamber 201. Furthermore, the valve 36 installed in the gas pipe 6 is opened. An inert gas such as an N$_2$ gas or the like, the flow raw of which is adjusted by the flow rate controller 33, is supplied from the gas pipe 6 into the process chamber 201 to purge the interior of the process chamber 201. At this time, the exhaust pipe heater 20 heats the exhaust pipe 231.

Furthermore, the valve 39 installed in the gas pipe 40 is opened. An inert gas such as an N$_2$ gas or the like is also supplied from the gas pipe 40 into the process chamber 201. At this time, the gas pipe heater 22 heats the gas pipe 10 and the gas pipe 40.

A cycle including steps S1 to S4 described above is repeated multiple times, thereby forming a SiN film having a predetermined film thickness on each of the wafers 200.

(Substrate Unloading Step S106)

Thereafter, the boat 217 that holds the wafers 200 on which the SiN films are formed is unloaded from the process chamber 201.

According to the present embodiment, the precursor (HCDS) gas is supplied from the gas pipe 10 into the process chamber 201 while heating the gas pipe 10 with at least the gas pipe heater 22. The raw material gas is exhausted from the process chamber 201 through the exhaust pipe 231. It is therefore possible to reduce temperature unevenness in the gas pipe 10 and the exhaust pipe 231. Thus, the gas temperature within the process chamber 201 and the gas supply/exhaust stability are improved. As a result, it is possible to supply the raw material gas into the process chamber at a desired gas flow rate. This makes it possible to improve the film formation uniformity. While repeating the cycle, including steps S1 to S4 multiple times, the exhaust pipe 231 may be continuously heated by the exhaust pipe heater 20, and the gas pipes 10 and 40 may be continuously heated by the gas pipe heater 22. This acts in a direction in which the intensity of a heating condition grows smaller. Thus, it becomes easy to control the temperature.

In the present embodiment, there is illustrated an example in which HCDS is supplied as the raw material gas. However, the present disclosure is not limited thereto. As described above, according to the pipe heater of the present embodiment, it is possible to heat other raw material gases to a liquefaction or solidification temperature or higher without generating heating unevenness. This makes it possible to stably supply the raw material gases.

[Example]

Hereinafter, descriptions will be made on the gas pipe heater 22 as the heating part 310 according to the present disclosure.

Figure 4A:
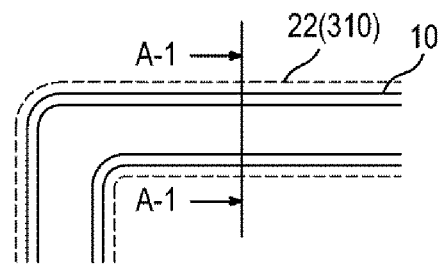
FIG. 4A is a sectional view for explaining, a configuration of a pipe heater used in an embodiment of the present disclosure.
Figure 4B:
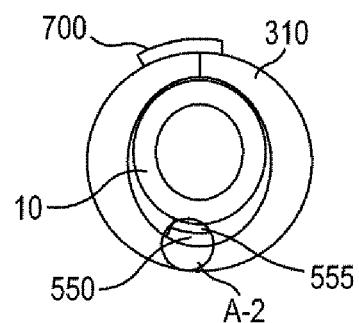
FIG. 4B is a horizontal sectional view for explaining the configuration of the pipe heater used in the embodiment.
Figure 4C:
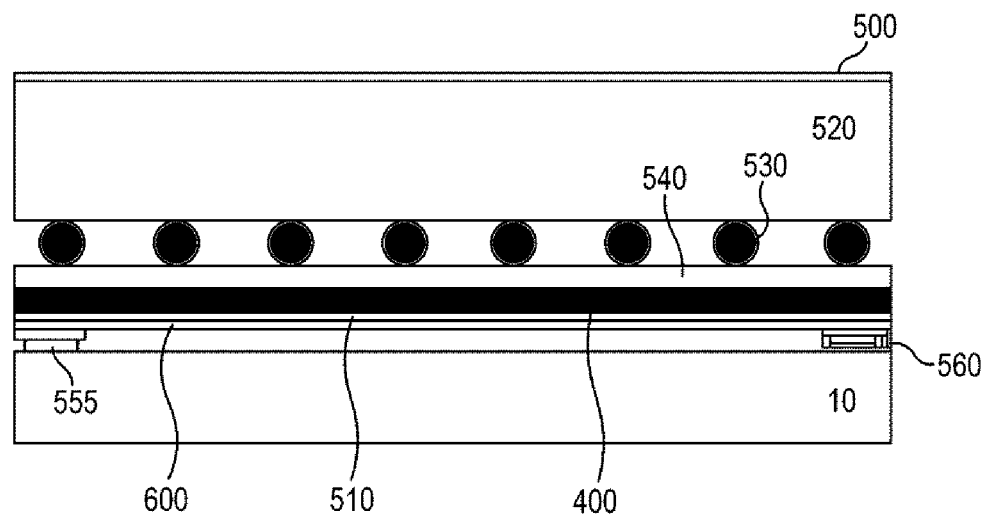
FIG. 4C is a sectional view for explaining the details of the configuration of the pipe heater used in the embodiment.

FIG. 4A is an enlarged view of a region designated by A in FIG. 1. FIG. 4A illustrates one enlarged example of a gas-flow-direction cross section of the gas pipe 10 to which the heating part 310 is installed. FIG. 4B is a sectional view taken along line A-1-A-1 in FIG. 4A. FIG. 4B illustrates a state in which the heating part $10 is installed on the outer periphery of the gas pipe 10. FIG. 4C is a partially enlarged view of a region designated by A-2 in FIG. 4B. In FIG. 4C, for the sake of convenience in description, the gas pipe 10 is illustrated to be positioned at the lowermost position. FIG. 4C illustrates the laminated structure of the heating part 310 in an easy-to-understand manner. Hereinafter, the configuration of the heating part 310 will be described mainly with reference to FIGS. 4B and 4C.

As illustrated in FIGS. 4B and 4C, the heating part 310 heats the gas pipe 10 made of a metallic material such as SUS or the like in a state where the heating part 310 is installed to cover a surface of the gas pipe 10. The heating part 310 is surrounded by an inner layer portion 510 positioned at the side of the gas pipe 10 and an outer layer portion 500 positioned at the atmospheric side, which are used as an enclosure. The enclosure is configured to enclose at least a heater wire 530 as a heat generation body which is a heating source, and a thermal insulation portion 520 disposed outside the heat generation body 530. In addition, the heating part 310 is configured to include a fastening part 700 installed outside the enclosure (the outer layer portion 500) and configured to fasten one end portion and the other end portion of the enclosure (the outer layer portion 500) while keeping the one end portion and the other end portion of the enclosure (the outer layer portion 500) adjacent to each other, and a temperature sensing part 555 disposed closer to the gas pipe 10 than the enclosure (the inner layer portion 510) at a position facing the surface of the gas pipe 10 and formed in a plate shape with a major surface thereof oriented toward the gas pipe 10. In some embodiments, as illustrated in FIGS. 4A to 4C, for example, the heating part 310 includes the heat generation body 530 such as the heater wire, the thermal insulation portion 520 disposed between the heat generation body 530 and the outer layer portion 500, and the enclosure (the inner layer portion 510 and the outer layer portion 500) which encloses the heat generation body 530 and the thermal insulation portion 520. The heating part 310 includes a laminated body obtained by laminating the heat generation body 530, the heat generation portion equipped with the thermal insulation member 540 as a support portion for supporting the heat generation body 530, and the thermal insulation portion 520 disposed outside the heat generation body 530. As illustrated in FIG. 4C, a metal sheet 400 is interposed between the heat generation portion and the inner layer portion 510. An insulation member 600 is interposed between the inner layer portion 510 and the gas pipe 10. The heat generation body 530 is supported on the thermal insulation member 540 by sewing the heat generation body 530 to the thermal insulation member 540 with a fibrous body such as a yarn or the like. FIG. 4B illustrates a state in which, when installing the heating part 310 to the outer periphery of the gas pipe 10, one end portion and the other end portion of the enclosure are brought close to each other and a small gap between the one end portion and the other end portion of the enclosure is covered by the fastening part 700. The fastening part 700 will be described later.

The thermal insulation member 540 is made of a glass cloth material. The enclosure including the inner layer portion 510 and the outer layer portion 500 may be made of a fluorine resin material, specifically polytetrafluroethylene (PTFE) which is one example of the fluorine resin material. The insulation member 600 may be made of a thermal insulation material differing from the material of the enclosure. If the insulation member 600 is made of a material larger in thermal storage degree than the enclosure, it is easy to make the beating condition of the gas pipe 10 uniform. For example, the insulation member 600 may be made of an alumina cloth material larger in thermal storage degree than a glass cloth material. The metal sheet 400 need not be metal but may be for example, graphite. The thermal insulation portion 520 may be any thermal insulation member for suppressing escape of heat from the heat generation body 530. For example, an inorganic fiber mat obtained by assembling a glass fiber, a ceramic fiber, a silica fiber and the like and then subjecting them to needle processing may be used as the thermal insulation portion 520. Furthermore, the thermal insulation portion 520 may be produced by molding an inorganic binder such as colloidal silica, alumina sol, sodium silicate or the like, or an organic binder such as starch or the like, into a mat shape. In addition, the thermal insulation portion 520 may be a porous compact made of a heat-resistant organic resin such as aramid, polyamide, polyimide or the like.

The heating part 310 includes a temperature sensing part 555 such as a plate-shaped heat collecting plate installed between the insulation member 600 and the gas pipe 10. For example, a thermocouple 550 may be connected to the temperature sensing part 555. In some embodiments, a thermostat 560 as a temperature switch may be installed to cut off an electric current when the temperature of the gas pipe 10 becomes equal to or higher than a predetermined temperature. While in the figures, the thermostat 560 has been illustrated to be installed outside the enclosure, the thermostat 560 may be installed inside the heating part 310. Thus, in the beating part 310, the supply of an electric current to the heat generation body is controlled using the temperature sensor including the thermostat 560 and the thermocouple 550, so that the temperature of the gas pipe 10 is maintained at a predetermined temperature.

Figure 5A:
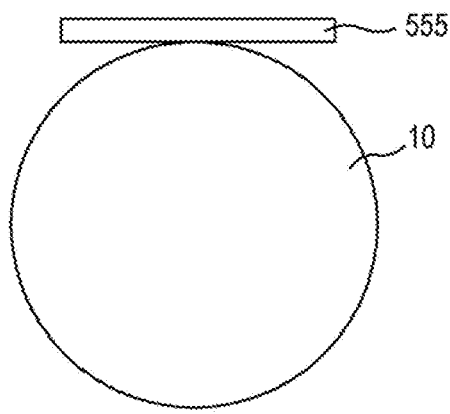
FIG. 5A is a sectional view illustrating a first example of a temperature sensing part used in an embodiment of the present disclosure.
Figure 5B:
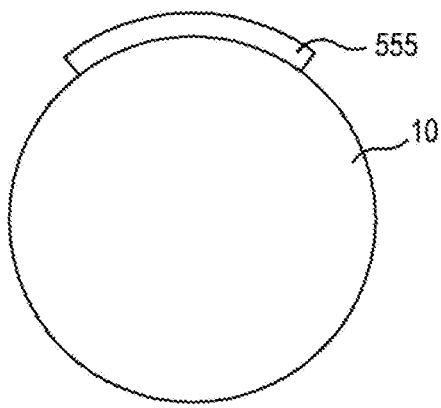
FIG. 5B is a sectional view illustrating a second example of a temperature sensing. part used in an embodiment of the present disclosure.
Figure 5C:
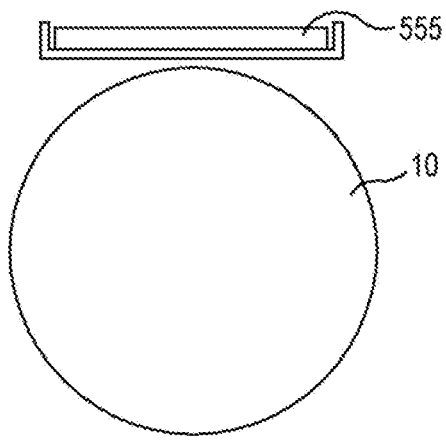
FIG. 5C is a sectional view illustrating a third example of a temperature sensing part used in an embodiment of the present disclosure.

When the heating part 310 covers the gas pipe 10, the temperature sensing part 555 is configured to adjoin the gas pipe 10. In FIGS. 5A to 5C, there is illustrated the positional relationship between the temperature sensing part 555 and the gas pipe 10. All the temperature sensing pan 555 illustrated in FIGS. 5A to 5C are formed in a plate shape with their major surfaces oriented toward the gas pipe 10.

FIG. 5A is a sectional view illustrating a first example in which the temperature sensing pan 555 is formed in a flat plate shape with the central portion thereof making contact with the gas pipe 10. By employing this configuration, it becomes easy for the heat to be directly radiated from the contact portion of the gas pipe 10 to the temperature sensing part 555. Since the surface area of the major surface of the temperature sensing pan 555 facing the gas pipe 10 is large, it is easy for the temperature sensing part 555 to sense the thermal state of the gas pipe 10 and to accurately detect the temperature of the gas pipe 10. Thus, the measured temperature is stabilized and the temperature of the entire gas pipe 10 is stabilized. It is therefore possible to improve the temperature reproducibility and to improve the temperature uniformity.

FIG. 5B is a sectional view illustrating a second example in which the temperature sensing part 555 is formed in a plate shape and is bent along the surface of the gas pipe 10 so that the majority of the temperature sensing part 555 makes contact with the gas pipe 10. In some embodiments, the bent state of the temperature sensing part 555 is such that the major surface of the temperature sensing part 555 oriented toward the gas pipe 10 has the same bent state as the bent state of the outer periphery of the gas pipe 10. The entire major surface of the heat collecting plate 555 oriented toward the gas pipe 10 may be configured to make contact with the outer periphery of the gas pipe 10. By employing this configuration, it is possible to increase the contact area between the temperature sensing part 555 and the gas pipe 10. Thus, it becomes easy for the heat to be directly radiated from the contact portion of the gas pipe 10 to the temperature sensing part 555. By increasing the temperature acquisition area, it is possible to stably acquire an accurate temperature, whereby the reliability of the detected temperature is improved. Thus, the measured temperature is stabilized and the temperature of the entire gas pipe 10 is stabilized. It is therefore possible to improve the temperature reproducibility and to improve the temperature uniformity.

FIG. 5C is a sectional view illustrating, a third example in which the temperature sensing part 555 is formed in a flat plate shape and is spaced apart from the gas pipe 10 so that the temperature sensing part 555 does not make contact with the gas pipe 10. By employing this configuration, the temperature of the gap adjoining the gas pipe 10 is measured by the temperature sensing part 555 having a large surface area. This makes it easy to measure the temperature of the entire gas pipe 10. Thus, the measured temperature is stabilized and the temperature of the entire gas pipe 10 is stabilized. It is therefore possible to improve the temperature reproducibility and to improve the temperature uniformity. This is particularly useful in the configuration of a flexible tube in which the size of the gas pipe 10 varies depending on the points, the thermal capacity thereof is smaller than that of a straight pipe, and the internal temperature of the gas pipe 10 is likely to sharply increase or decrease. In some embodiments, an intermediate member may be interposed between the temperature sensing part 555 and the gas pipe 10. The shape of the temperature sensing part 555 may be one selected from a circular shape, an elliptical shape and a polygonal shape. In some embodiments, the thickness of the temperature sensing part 555 may be set smaller than that of the major surface so that the surface oriented toward the gas pipe 10 becomes the major surface. In this case, it becomes easy to collect the heat.

Figure 11:
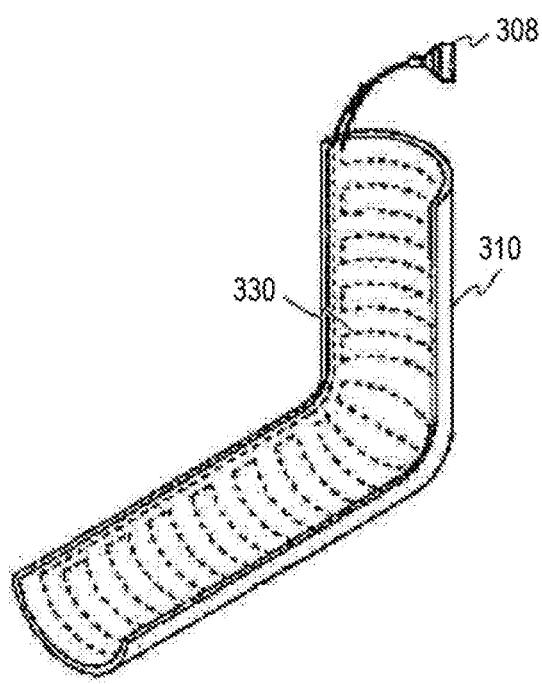
FIG. 11 is a view illustrating one example of a developed enclosure of a pipe heater used in an embodiment of the present disclosure.

As illustrated in FIG. 11 to be described later, the heating part 310 is configured so that, if the enclosure is developed, the heating part 310 has a substantially rectangular shape with the longitudinal direction thereof extending in the extension direction of the gas pipe 10. If the enclosure is installed to the outer periphery of the gas pipe 10 so that the one end portion and the other end portion of the enclosure are brought close to each other, the enclosure covers the entire outer periphery of the gas pipe 10. That is to say, the enclosure is configured so that, when installed to the gas pipe 10, the enclosure covers the outer periphery of the gas pipe 10 in a state in which one end portion and the other end portion, of the enclosure adjoin each other.

As described above and as illustrated in FIGS. 4 and 5, the heating part 310 is configured so that the plate-shaped temperature sensing part 555 is installed in the thermocouple 550 and is installed at a position facing the gas pipe 10. Thus, the measured temperature of the gas pipe 10 is more stable than when the temperature sensing part 555 is not used. It is therefore possible to ensure the temperature reproducibility and the temperature uniformity and to uniformly heat the gas pipe 10 to a predetermined temperature. By bringing the shape of the temperature sensing part 555 into conformity with the bent shape of the gas pipe 10, it is possible to further ensure the stability of the measured temperature of the gas pipe 10 and the temperature reproducibility. Thus, the reliability of the temperature control of the gas pipe 10 is improved.

As illustrated in FIG. 4, the heating part 310 is configured so that the insulation member 600, which is larger in heat storage degree than the inner layer portion 510, is installed between the gas pipe 10 and the inner layer portion 510, and so that the thermal energy generated from the heat generation body 530 is absorbed by the insulation member 600 so as to heat the gas pipe 10 through the radiation of heat from the insulation member 600. With this configuration, the heating unevenness attributable to the shape of the heat generation body 530 is alleviated. It is therefore possible to uniformly heat the gas pipe 10 and to expect improvement in temperature uniformity.

Figure 6:
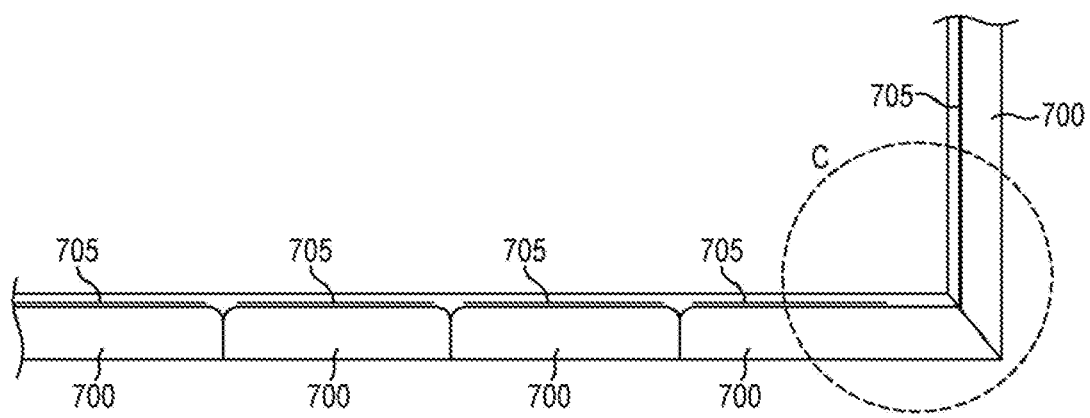
FIG. 6 is an overview for explaining a configuration in which a pipe heater used in an embodiment of the present disclosure is coated on a gas pipe.

FIG. 6 is an overview illustrating; a state in which the gas pipe 10 is covered with the heating part 310. Fastening pans 700 are configured to fasten one end portion and other end portions of the enclosure so that, when the enclosure is connected to the gas pipe 10, the enclosure covers the outer periphery of the gas pipe 10 in a state in which one end portion and other end portions of the enclosure adjoin each other.

In some embodiments, the fastening parts 700 may be fixed so that distal end portions of the fastening parts 700 are aligned on the basis of lines 705. By providing the lines 705 serving as a reference in this way, a worker can perform an installation work on the basis of the lines 705. It is therefore possible to suppress variations in the installation state and to improve the uniformity of the adhesion degree of the heating part 310 while enhancing the workability.

As illustrated in FIG. 6, even if the gas pipe includes straight pipe portions formed in a linear shape and a bent portion configured to interconnect the straight pipe portions, it is possible to make the adhesion state of the heating part 310 uniform regardless of workers by aligning the distal ends of the fastening parts 700 on the basis of the lines 705 in the straight pipe portions of the gas pipe 10. Accordingly, it is presumed that the positional relationship between the temperature sensing part 555 and the gas pipe 10 remains the same in the plurality of straight pipe portions. Thus, it can be expected that the temperature of the gas pipe 10 is uniformly controlled in the respective straight pipe portions.

Figure 7A:
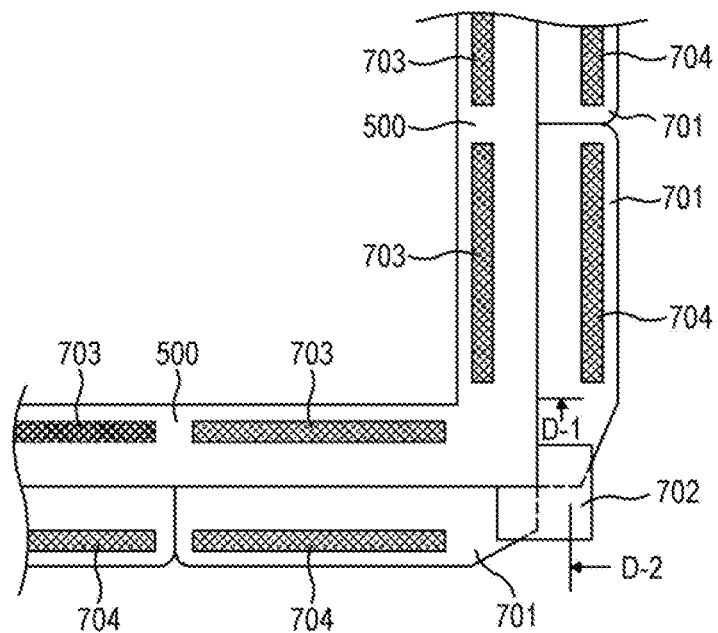
FIG. 7A is a developed view for explaining a configuration of a fastening part used in an embodiment of the present disclosure.
Figure 7B:
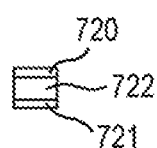
FIG. 7B is a sectional view for explaining a cover portion of the fastening part used in the embodiment.
Figure 7C:
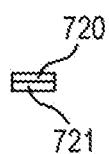
FIG. 7C is a sectional view for explaining, an auxiliary cover portion of the fastening part used in the embodiment.

A region C surrounded by a broken line in FIG. 6 indicates the bent portion of the gas pipe 10. FIG. 7A is a developed view of the fastening part 700 disposed on the outer periphery of the bent portion C in FIG. 6. FIG. 7B is a sectional view of a cover portion 701 taken along line D-1. FIG. 7C is a sectional view of an auxiliary cover portion 702 taken along line D-2.

The fastening part 700 includes a cover portion 701, a bonding portion 704 installed in the cover portion 701, and a bonding portion 703 installed in the outer layer portion 500 of the enclosure. For example, the bonding portion 704 and the bonding portion 703 are configured as hook-and-loop fasteners. The bonding portion 704 and the bonding portion 703 are configured to be bonded and separated. If the bonding portion 704 and the bonding portion 703 are combined and pressed against each other, they are bonded. If the cover portion 701 is pulled away from the outer layer portion 500 by holding a portion of the cover portion 701, the bonding portion 704 and the bonding portion 703 are separated. The cover portion 701 is made of a fluorine resin material such as PTFE or the like. In some embodiments, the cover portion 701 is formed of plural sheets (two sheets, in the present embodiment) of fluorine resin material 720 and 721. The bonding portion 704 is sewn to the fluorine resin material existing at the side of the outer layer portion 500. The stitch of the bonding portion 704 is not seen from the outer side of the heating part 310 which is the opposite side of the outer layer portion 500. In some embodiments, as illustrated in the sectional view of FIG. 7B, if a glass cloth material 722 as a reinforcing material is interposed between the sheets of fluorine resin material 720 and 721, the strength of the cover portion 701 is increased and the shape of the cover portion 701 is stabilized. The cover portion 701 can be bonded with ease. It becomes easy to limit the escape of heat from a small gap between one end portion and the other end portion of the cover portion 701 adjoining each other.

In some embodiments, the auxiliary cover portion 702 configured to cover the bent portion may be provided in order to easily limit the escape of heat from the bent portion of the gas pipe 10. The auxiliary cover portion 702 is enfolded in the over portion 701 and is configured to cover the bent portion of the gas pipe 10. In some embodiments, one end portion of the auxiliary cover portion 702 is fixed, at the side of the gas pipe 10, to one of the cover portions 701 existing in each of the adjoining straight pipe portions and just adjoining the bent portion. The other end portion of the auxiliary cover portion 702 is allowed to extend toward the other cover portion 701 at the side of the gas pipe 10 and is enfolded in each of the cover portion 701 so as to cover the bent portion of the gas pipe 10. By doing so, it is possible to further limit the escape of heat from the bent portion of the gas pipe 10. The auxiliary cover portion 702 is made of a fluorine resin material such as PIPE or the like. If the auxiliary cover portion 702 is formed of one sheet of fluorine resin material, it is possible to easily cover the bent portion having a complex shape with an increased adhesion degree while ensuring flexibility and to easily limit the escape of heat from the bent portion of the gas pipe 10. In some embodiments, as illustrated in FIG. 7C, the auxiliary cover portion 702 may be formed of plural sheets (two sheets, in the present embodiment) of fluorine resin material 720 and 721. By doing so, it is possible to cover the bent portion having a complex shape with a further increased adhesion degree while ensuring the flexibility and to further suppress escape of heat from the bent portion of the gas pipe 10.

In the present embodiment, a reinforcing member (glass cloth material) 722 for maintaining the strength of the cover portion 701 is installed within the cover portion 701. On the other hand, for the purpose of ensuring flexibility, a thermal insulation material (glass cloth) or the like is not installed within the auxiliary cover portion 702 to prevent exposure of the gas pipe 10. Thus, the auxiliary cover portion 702 is easily enfolded in the cover portion 701 and is capable of covering a gas pipe having it complex shape. Furthermore, the workability is improved. If the auxiliary cover portion 702 is interposed between and fixed to the adjoining cover portions 701, the adhesion degree is further improved. A sheet-like thermal insulation material may be used as the reinforcing material 722 of the cover portion 701. If the thermal insulation material is too thick, it may adversely affect the work of bonding and separating the bonding portion 704 of the cover portion 701 to and from the bonding portion 703. By forming the thermal insulation material in a sheet-like shape, it is possible to embed plural sheets of thermal insulation material as the reinforcing material 722 in the cover portion 701 and to maintain the strength of the cover portion 701.

As described above, even if the gas pipe 10 has a bent portion, the exposure of the gas pipe 10 can be prevented by installing the cover portion 701 and the auxiliary cover portion 702. Thus, a local temperature reduction is suppressed. It is therefore possible to improve the temperature uniformity of the entire gas pipe 10.

Next, descriptions will be made on the configuration of the heating part 310 which is used to cover a flexible pipe such as a bellows (a pipe formed in a bellows shape) or the like.

Figure 10A:
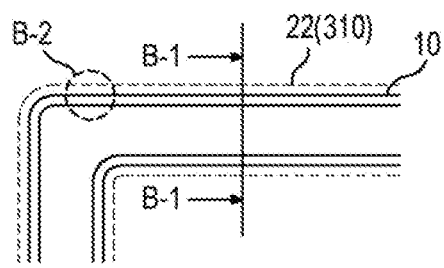
FIG. 10A is a sectional view for explaining a configuration of a pipe heater used in an embodiment of the present disclosure.
Figure 10B:
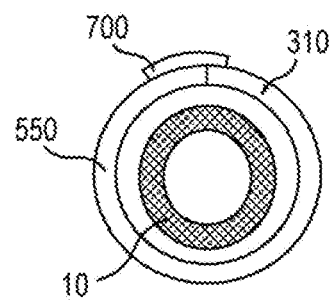
FIG. 10B is a horizontal sectional view for explaining the configuration of the pipe heater used in the embodiment.
Figure 10C:
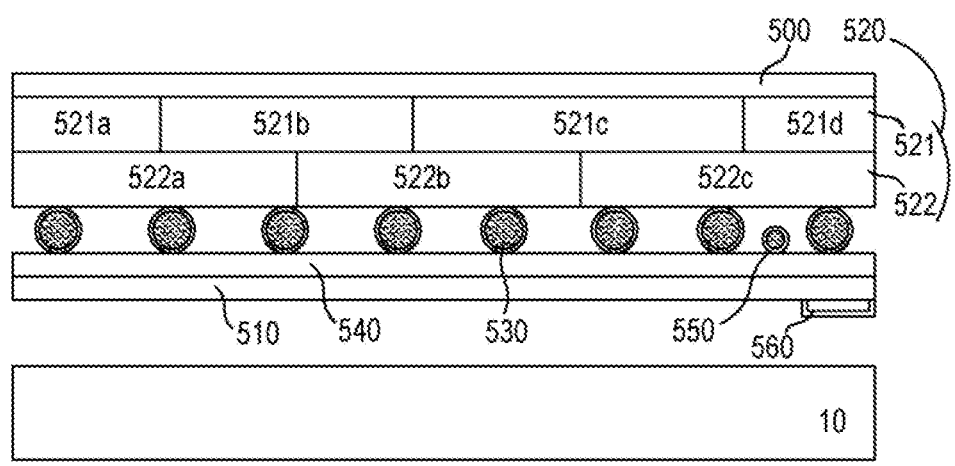
FIG. 10C is a sectional view for explaining the details of the configuration of the pipe beater used in the embodiment.

FIG. 10A is an enlarged view of a region designated by B in FIG 1. FIG. 10A illustrates one example of a gas-flow-direction cross section of a flexible pipe 10 covered by the heating part 310 which is used to cover the flexible pipe 10 among the gas pipes 10. FIG. 10B, which is a sectional view taken along line B-1, illustrates a state in which, when installing the heating part 310 on the outer periphery of the flexible pipe 10, one end portion and the other end portion of the enclosure are brought close to each other and a small gap existing between one end portion and the other end portion of the enclosure is covered by a fastening part 700. FIG. 10C is an enlarged view of a region designated by B-2 in FIG. 10A. Hereinafter, the heating part 310 will be described with reference to FIGS. 10B and 10C.

As can be noted from the sectional view of FIG. 10B, a gap is formed between the heating part 310 and the flexible pipe 10. This is because the inner diameter of the heating part 310 is set larger than the outer diameter of the flexible pipe 10. The temperature stability is ensured by heating the air existing in the gap thus formed. In addition, the follow-up to the bending is ensured by increasing the inner diameter of the heating part 310.

As illustrated in FIG. 10C, the heating part 310 installed to the flexible pipe 10 is mainly configured by laminating a heat generation portion, which includes a heat generation body 530 as a heat generation body and a thermal insulation member 540 as a support part for supporting the heat generation body 510, and an thermal insulation portion 520 disposed at the opposite side of the heat generation body 530 from the as pipe 10, between an inner layer portion 510 and an outer layer portion 500 as an enclosure. The installation of the thermal insulation member 540 of the heat generation body 530 is the same as the installation in the heat generation body 530 illustrated in FIG. 4C. Thus, the descriptions thereof will be omitted.

The flexible pipe 10 (designated by B in FIG. 1) is smaller in heat capacity than the straight pipe portion (designated by A in FIG. 1) which is a portion of the gas pipe 10. Thus, if the temperature is controlled by installing a temperature sensing part in the flexible pipe 10, the temperature of the flexible pipe 10 grows higher than the temperature of the straight pipe portion. A temperature difference is generated in one gas pipe 10, which deteriorates the temperature uniformity. Accordingly, the flexible pipe 10 is heated by the heating part 310 illustrated in FIG 10C. A thermocouple 550 is installed in the heat generation portion. For example, similar to the heat generation body 530, the thermocouple 550 is sewn to the thermal insulation member 540.

As illustrated in FIG. 10C, a gap is formed between the inner layer portion 510 of the enclosure and the flexible pipe 10. In the gap, there are installed a thermostat 560 and an isolation portion for isolating the thermostat 560 from the flexible pipe 10. The thermostat 560 is installed outside the enclosure. Alternatively the thermostat 560 may be installed inside the heating part 310. For example, similar to the thermocouple 550, the thermostat 560 may be sewn to the thermal insulation member 540.

As described above, in the heating part 310 according to the present embodiment, a gap is formed between the flexible pipe 10 and the inner layer portion 510 of the heating part 310. The thermocouple 550 is installed within the heating part 310 (in the heat generation portion). It is therefore possible to eliminate the temperature control instability attributable to the measurement of a local temperature change otherwise caused by the contact of the thermocouple 550 with the flexible pipe 10. This makes it possible to uniformly heat the entire flexible pipe 10. In this way, the thermocouple 550 is installed in the thermal insulation member 540 similar to the heat generation body 530. It is therefore possible for the heating part 310 to include all kinds of bending shapes. Thus, the installation and removal of the heating part 310 is easy and the workability is improved.

Since the thermocouple 550 has such a structure, the stability of the measured temperature is improved and the temperature reproducibility is ensured. Accordingly, it is possible to improve the temperature uniformity within the flexible pipe 10.

Furthermore, the heat generation body 530 is formed using the flexible pipe 10 as a base axis so that a portion of the heat generation body 530 becomes parallel to the ridge portion and the valley portion of the bellows of the flexible pipe 10. In some embodiments, the main portion of the heat generation body 530 is formed in a serpentine shape, using the flexible pipe 10 as a base axis, so as to extend in a direction parallel to the bending direction of the flexible. pipe 10. It is therefore possible to reliably prevent suppression of the bending function of the flexible pipe 10.

As illustrated in the sectional view of FIG. 10C, the thermal insulation portion 520, which covers the heat generation body 530, has a laminated structure (a two-layer structure in the present embodiment) formed of a plurality of thermal insulation layers. The thermal insulation layer existing at the upper side (at the side of the outer layer portion 500) is designated by reference numeral 521 and the thermal insulation layer existing at the lower side (at the side of the heat generation body 530) is designated by reference numeral 522. In the respective thermal insulation layers, the thermal insulation member has a divided structure. As illustrated in FIG. 10C, the thermal insulation layer 521 is divided into four thermal insulation regions 521a, 521b, 521c and 521d. The thermal insulation layer 522 is divided into three thermal insulation regions 522a, 522b and 522c.

Each of the thermal insulation layers 521 and 522 is cut (split) in a direction perpendicular to the flow direction of a gas flowing through the flexible pipe 10 and is divided into a plurality of thermal insulation regions. For example, if the thermal insulation layer 522 is divided into three thermal insulation regions 522a, 522b and 522c, it is possible for the thermal insulation layer 522 to absorb a bending stress. This enables the heating part 310 to be flexibly bent. The thermal insulation layers 521 and 522 are disposed so that the positions of incisions (slits) are staggered in the respective thermal insulation layers. This makes it possible to suppress escape of heat. In some embodiments, slits may be formed between the respective thermal insulation regions instead of dividing the thermal insulation regions. In this case, the ability to absorb a bending stress is smaller than that of the divided structure. However, there is no need for sewing to interconnecting the divided portions. This makes it possible to improve the manufacturing efficiency. In some embodiments, the thermal insulation layers 521 and 522 may be made of a glass mat material.

As illustrated in FIG. 11, the heating part 310 used in the flexible pipe 10 is configured so that, if the enclosure is developed, the heating part 310 has a substantially rectangular shape with the longitudinal direction thereof extending in the extension direction of the flexible pipe 10. If the enclosure is installed on the outer periphery of the flexible pipe 10 so that the one end portion and the other end portion of the enclosure are brought close to each other, the enclosure covers the entire outer periphery of the flexible pipe 10.

The heat generation body 530 indicated by a broken line in FIG. 11 is formed in a serpentine shape, using the flexible pipe 10 as a base axis, so as to extend in a direction parallel to the bending direction of the flexible pipe 10. With this configuration, the ability to replicate the bending shape of the flexible pipe 10 is improved.

The heat generation body 530 is coupled to the controller 321 (not shown in this figure) via a connector 308. The heat generation body 530, the thermocouple 550 and the thermostat 560 (both not shown in this figure) are controlled by the controller 321.

Figure 8A:
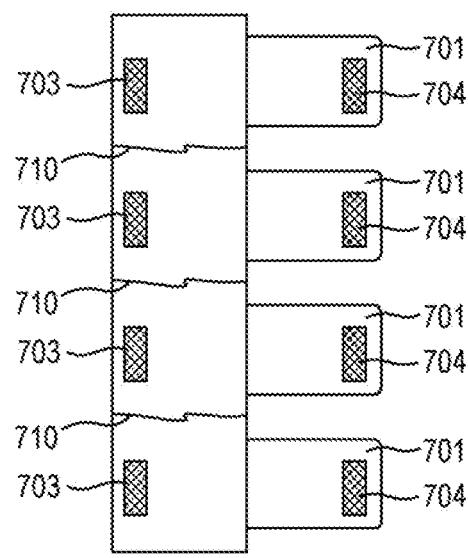
FIG. 8A is a developed view of the fastening part for a pipe heater used in an embodiment of the present disclosure.
Figure 8B:
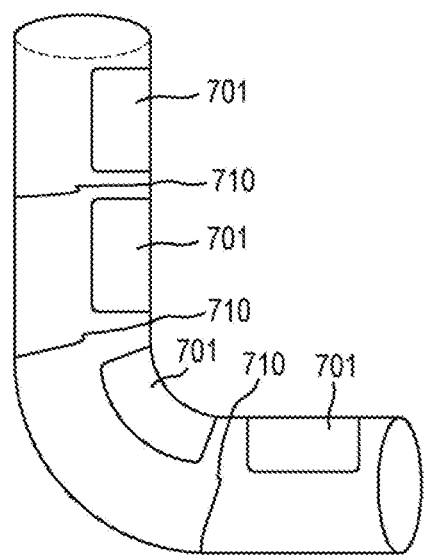
FIG. 8B is an overview for explaining a configuration in which the pipe heater used in the embodiment is coated on a gas pipe.

FIG. 8A is a developed view of the fastening part 700 of the heating part 310 used in the flexible pipe 10. FIG. 8B is a perspective view illustrating a state in which the heating part 310 is installed to the flexible pipe 10. The components designated by the same reference numerals as used in FIGS. 6 and 7 are identical in configuration and material with the components described above. These components have been described above and, therefore, the descriptions thereof will be simplified here.

The fastening part 700 configured to fasten one end portion and the other end portion of the enclosure adjoining each other includes a cover portion 701, a bonding portion 704 installed in the cover portion 701 and a bonding portion 703 installed in the outer layer portion 500 of the enclosure. With this configuration, it is possible to suppress escape of heat from a small gap between one end portion and the other end portion of the enclosure adjoining each other.

In the outer layer portion 500, there are formed folding lines 710 which extend in a direction perpendicular to the flow direction of a gas flowing through the flexible pipe 10. Due to the formation of the folding lines 710, the fastening part 700 can be bent to cover the flexible pipe 10.

While in the above embodiment, the heating part 310 has been described to be fixed by the fastening part 700, the present disclosure is not particularly limited thereto. In addition to the hook-and-loop fastener, it may be possible to use other well-known fixing means such as a hook, a buckle and the like.

<Effects According to the Present Embodiment>

According to the present embodiment, one or more of the following effects (a) to (h) may be achieved.

(a) According to the present embodiment, a plate-shaped temperature sensing part is installed in a thermocouple. The temperature sensing part is installed at a position facing a gas pipe. Thus, it is possible to acquire a temperature by bringing the temperature sensing part dose to the gas pipe which supplies a raw material gas. This makes it possible to uniformly heat the gas pipe. In particular, the temperature sensing part is installed in conformity with the shape of the gas pipe. It is therefore possible to uniformly heat the gas pipe and to improve the heating reliability.

(b) According to the present embodiment, the plate-shaped temperature sensing part is installed at a position facing the gas pipe. Thus, as compared with a case where the temperature sensing part does not exist, a surface area of the major surface oriented toward the gas pipe becomes larger. It is therefore easy to sense the thermal state of the gas pipe and to accurately sense the temperature of the gas pipe. For that reason, the measured temperature is stabilized and the temperature of the entire gas pipe is stabilized. It is therefore possible to improve the temperature reproducibility and the temperature uniformity.

(c) According to the present embodiment, even if the gas pipe includes a plurality of straight pipe portions formed in a linear shape and a bent portion configured to interconnect the straight pipe portions, it is possible to, when fixing the heating part by bringing one end portion and the other end portion of the enclosure close to each other, make the adhesion state of the heating part in the respective straight pipe portions of the gas pipe uniform regardless of workers.

(d) According to the present embodiment, even if the gas pipe includes a plurality of straight pipe portions formed in a linear shape and a bent portion configured to interconnect the straight pipe portions, when the heating part is fixed by bringing one end portion and the other end portion of the enclosure close to each other in the bent portion of the gas pipe, the auxiliary cover portion covers the bent portion in a state in which the auxiliary cover portion is enfolded in the cover portion adjoining the auxiliary cover portion. It is therefore possible to uniformly heat the entire gas pipe.

(e) According to the present embodiment, even if the gas pipe for supplying the raw material gas is a flexible pipe formed in a bellows shape, the temperature of the gas pipe can be acquired in a state in which the temperature sensing part is spaced apart from the gas pipe. It is therefore possible to accurately control the temperature of the gas pipe.

(f) According to the present embodiment, even if the gas pipe for supplying the raw material gas is a flexible pipe formed in a bellows shape, the enclosure of the heating part is spaced apart from the flexible pipe. It is therefore possible to acquire the temperature of the entire flexible pipe without being affected by a temperature change. This makes it possible to accurately control the temperature of the gas pipe.

(g) According to the present embodiment, it is possible to heat the gas pipe without unevenness to a temperature at which the raw material gas generated from a film forming liquid precursor is not liquefied. It is therefore possible to supply the raw material gas into the process chamber at a stable flow, for example, at a temperature which is controlled so as not to generate liquefaction of the vaporized raw material gas. Similarly, the reaction gas reacting with the raw material gas can be heated to a temperature which is controlled so as not to generate liquefaction of the raw material gas. It is therefore possible to prevent reduction of the temperature of the raw material gas and resultant liquefaction of the raw material gas when the raw material gas is mixed with the reaction gas. It is also possible to stably supply the raw material gas into the process chamber and to uniformly form a film by stabilizing the gas temperature within the process chamber.

(h) According to the present embodiment, it is possible to heat the exhaust pipe to a predetermined temperature without unevenness. This makes it possible to restrain a residue of an unreacted gas (unreacted raw material gas) and a byproduct from adhering to the exhaust pipe.

(i) The effects described above can be similarly achieved even when a gas other than the HCDS gas is used as the raw material gas, when a gas other than the $NH_3$ gas is used as the N-containing gas, or when an inert gas other than the $N_2$ gas is used as the purge gas.

In the present embodiment, there has been illustrated an example in which both the gas pipe and the exhaust pipe are heated by heaters. However, the present disclosure is not limited to the present embodiment. One of the gas pipe and the exhaust pipe may be heated by a heater.

Furthermore, there has been illustrated the configuration in which the gas pipe extending from the gas supply part 4 to the flow rate controller 41 is heated. However, it is not necessary to always heat the gas pipe extending from the gas supply part 4 to the flow rate controller 41. The gas pipe extending from the gas supply part 4 to the flow rate controller 41 may be heated during abnormal work (maintenance, repair, etc.).

<Another Embodiment>

Next, another embodiment will be described with reference to FIG. 9.

Figure 9:
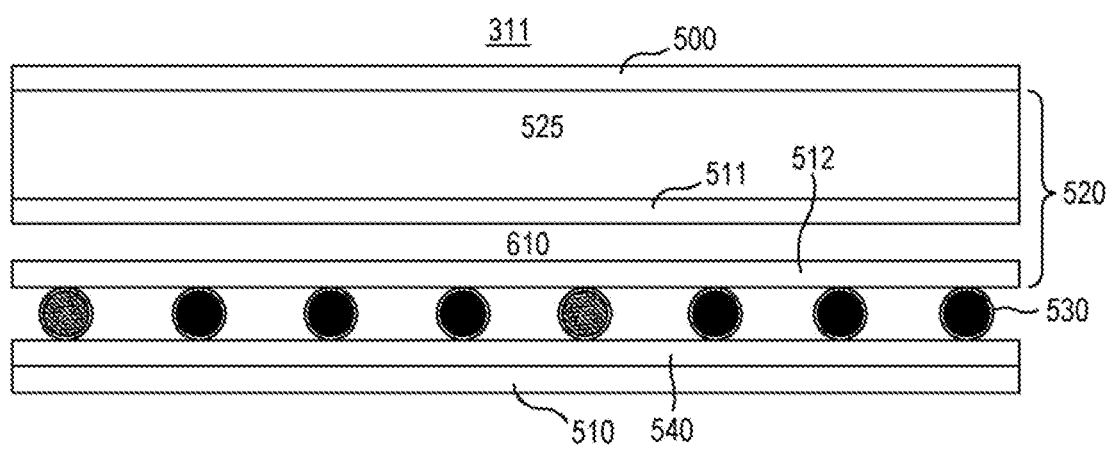
FIG. 9 is a sectional view of a configuration of a pipe heater used in another embodiment of the present disclosure.

As illustrated in FIG. 9, a heating part 311 is mainly configured by laminating a heat generation portion, which includes a heater wire 530 as a heat generation body and a thermal insulation member 540 as a support part for supporting, the heater wire 530, and an thermal insulation portion 520 disposed at the opposite side of the heat generation body 530 from the gas pipe 10, between an inner layer portion 510 and an outer layer portion 500 as an enclosure. The installation of the support part 540 of the heat generation body 530 is the same as the installation in the heating part 310 illustrated in FIG. 4A. Thus, the descriptions thereof will be omitted.

The thermal insulation portion 520 is a laminated structure of an air gap portion 610 and an insulation portion 525. The air Rap portion 610 is a space formed between an upper enclosure portion 511 and a lower enclosure portion 512. This configuration enhances the effect of insulating heat generated from the heat generation portion. With this configuration, it is possible to limit the amount of heat that escapes and to improve the temperature performance.

The outer layer portion 500, the inner layer portion 510, the upper enclosure portion 511 and the lower enclosure portion 512 are thermal insulation members and may not be made of the same material. Even in the present embodiment, a thin metal sheet 400 and an insulation member 600 may be installed.

While the embodiments and examples of the present disclosure have been described in detail, the present disclosure is not limited, to the embodiments and examples described above but may be differently modified without departing from the spirit thereof.

According to the present embodiment, the heating part 310 is used in the gas pipe 10 which constitutes a flow path through which the raw material gas is supplied into the process chamber 201 via the nozzle 334. Thus, it is possible to limit deterioration of the temperature reproducibility for each substrate processing apparatus, which may be attributable to the variations in the installation state depending on workers when a ribbon heater, an insulation material and a thermal insulation material are installed independently of each other in a conventional ribbon heater.

Furthermore, in the conventional ribbon heater, the installation state varies depending on workers because the ribbon heater, the insulation material and the thermal insulation material are installed independently of each other. Furthermore, the temperature uniformity deteriorates due to the difference in heater adhesion degree or the exposure of the gas pipe 10. In the present embodiment, the heating part 310 is used in the gas pipe 10 which constitutes a flow path through which the raw material gas is supplied into the process chamber 201 (or the nozzle 334). Thus, the workability is improved, and the adhesion of the gas pipe heater is made uniform. In addition, it is possible to suppress deterioration of the temperature uniformity attributable to the difference in heater adhesion degree or the exposure of the gas pipe 10.

According to the present embodiment, unlike the conventional ribbon heater, it is not necessary to independently install the ribbon heater, the insulation material and the thermal insulation material. This makes it possible to shorten a period of time required in installing the heating pan 310.

In the aforementioned embodiments, there has been described an example in which the film is formed on the wafer. However, the present disclosure is not limited to this example. For example, the present disclosure may be applied to a case where an oxidation process, a diffusion process, an annealing process, an etching process or the like is performed with respect to the wafer or a film formed on the wafer.

In the aforementioned embodiments, there has been described the vertical substrate processing apparatus for a batch process. However, the present disclosure is not limited thereto. The present disclosure may be applied to a substrate processing apparatus for processing a single substrate.

The present disclosure may be applied not only to a semiconductor manufacturing apparatus for processing a semiconductor wafer, such as the substrate processing apparatus according to the present embodiment, but also to a liquid crystal display (LCD) manufacturing apparatus for processing a glass substrate.

According to the present disclosure in some embodiments, it is possible to reduce temperature unevenness in a gas pipe.

While certain embodiments have been described, these embodiments have been presented by way of example only, and are not intended to limit the scope of the disclosures. Indeed, the novel methods and apparatuses described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A heating part of covering and heating a surface of a gas pipe, comprising:
   a heat generation body;
   a thermal insulation portion disposed at an opposite side of the gas pipe with respect to the heat generation body;
   a thermal insulation member disposed at a side of the gas pipe with respect to the heat generation body, and configured to support the heat generation body;
   an enclosure that encloses the thermal insulation portion, the thermal insulation member, and the heat generation body, and includes:
      an outer layer portion disposed at an opposite side of the gas pipe with respect to the thermal insulation portion; and
      an inner layer portion disposed at a side of the gas pipe with respect to the thermal insulation member;
   a fastening part installed outside the outer layer portion and configured to fasten one end portion and an other end portion of the enclosure in a state in which the one end portion and the other end portion of the enclosure adjoin each other;
   an insulation member disposed closer to the gas pipe than the inner layer portion such that the insulation member is disposed between the gas pipe and the inner layer portion, a material of the insulation member being larger in thermal storage degree than a material of the inner layer portion;
a heat generation portion including the thermal insulation member on which the heat generation body is installed;
a metal sheet disposed farther from the gas pipe than the inner layer portion such that the metal sheet is interposed between the thermal insulation member and the inner layer portion; and
a temperature sensing part disposed to make contact with the surface of the gas pipe, in a gap between the insulation member and the gas pipe, at a position closer to the gas pipe than the inner layer portion, and formed in a plate shape having a major surface oriented toward the gas pipe
wherein the heat generation body is disposed outside the inner layer portion such that the inner layer portion is interposed between the temperature sensing part and the heat generation body.

2. The heating part of claim 1, wherein the temperature sensing part is configured so that the major surface is bent along a surface of the gas pipe.

3. The heating part of claim 1, wherein the gas pipe includes a flexible pipe formed in a bellows shape, and the temperature sensing part is disposed so as not to make contact with the flexible pipe.

4. The heating part of claim 1, further comprising: a thermal insulation member where the heat generation body is installed, wherein the temperature sensing part is installed to the thermal insulation member just like the heat generation body.

5. The heating part of claim 3, wherein the heat generation body of the heating part covering the flexible pipe is formed using the flexible pipe as a base axis so that a portion of the heat generation body becomes parallel to a ridge portion and a valley portion of a bellows of the flexible pipe.

6. The heating part of claim 3, wherein the thermal insulation portion of the heating part covering the flexible pipe is formed of a plurality of thermal insulation layers, and each of the thermal insulation layers is cut in a direction perpendicular to a flow direction of a gas flowing through the flexible pipe and divided into a plurality of pieces.

7. The heating part of claim 6, wherein slits extending in the direction perpendicular to the flow direction of the gas flowing through the flexible pipe are formed in each of the thermal insulation layers.

8. The heating part of claim 7, wherein the slits of the thermal insulation layers adjoining each other are disposed at staggered positions.

9. The heating part of claim 1, wherein the gas pipe includes a plurality of straight pipe portions formed in a linear shape and a bent portion configured to interconnect the straight pipe portions, wherein the fastening part of the heating part covering the straight pipe portions and the bent portion includes a cover configured to cover one end portion and the other end portion of each of the straight pipe portions, and an auxiliary cover configured to cover the bent portion is installed in the bent portion so that the auxiliary cover is enfolded in the cover.

10. The heating part of claim 9, wherein a sheet configured to increase strength of the cover is installed within the cover.

11. The heating part of claim 10, wherein the auxiliary cover is configured so that the sheet is not installed within the auxiliary cover.

12. A substrate processing apparatus, comprising:
a process chamber configured to process a substrate;
a gas supply system including a gas pipe configured to supply a raw material gas into the process chamber; and
a heating part configured to cover and heat a surface of the gas pipe,
wherein the heating part includes:
a heat generation body configured to heat the gas pipe;
a thermal insulation portion disposed at an opposite side of the gas pipe with respect to the heat generation body;
a thermal insulation member disposed at a side of the gas pipe with respect to the heat generation body, and configured to support the heat generation body;
an enclosure that encloses the thermal insulation portion, the thermal insulation member, and the heat generation body, and includes:
an outer layer portion disposed at an opposite side of the gas pipe with respect to the thermal insulation portion; and
an inner layer portion disposed at a side of the gas pipe with respect to the thermal insulation member;
a fastening part installed outside the outer layer portion and configured to fasten one end portion and an other end portion of the enclosure in a state in which the one end portion and the other end portion of the enclosure adjoin each other;
an insulation member disposed closer to the gas pipe than the inner layer portion such that the insulation member is disposed between the gas pipe and the inner layer portion, a material of the insulation member being larger in thermal storage degree than a material of the inner layer portion;
a heat generation portion including the thermal insulation member on which the heat generation body is installed;
a metal sheet disposed farther from the gas pipe than the inner layer portion such that the metal sheet is interposed between the thermal insulation member and the inner layer portion; and
a temperature sensing part disposed to make contact with the surface of the gas pipe, in a gap between the insulation member and the gas pipe, at a position closer to the gas pipe than the inner layer portion, and formed in a plate shape having a major surface oriented toward the gas pipe,
wherein the heat generation body is disposed outside the inner layer portion such that the inner layer portion is interposed between the temperature sensing part and the heat generation body.

13. The substrate processing apparatus of claim 12, further comprising an exhaust pipe through which the raw material gas is exhausted from the process chamber,
wherein the heating part is installed around the exhaust pipe.

14. The substrate processing apparatus of claim 12, further comprising a gas supply system configured to supply a reaction gas into the process chamber,
wherein the heating part is installed in the gas supply system.

15. A substrate processing apparatus, comprising:
a process chamber configured to process a substrate;
an exhaust pipe through which a raw material gas is exhausted from the process chamber; and
a heating part configured to cover and heat a surface of the exhaust pipe,
wherein the heating part includes:
a heat generation body configured to heat the exhaust pipe;

a thermal insulation portion disposed at an opposite side of the exhaust pipe with respect to the heat generation body;
a thermal insulation member disposed at a side of the exhaust pipe with respect to the heat generation body, and configured to support the heat generation body;
an enclosure that encloses the thermal insulation portion, the thermal insulation member, and the heat generation body, and includes:
  an outer layer portion disposed at an opposite side of the exhaust pipe with respect to the thermal insulation portion; and
  an inner layer portion disposed at a side of the exhaust pipe with respect to the thermal insulation member;
a fastening part installed outside the outer layer portion and configured to fasten one end portion and an other end portion of the enclosure in a state in which the one end portion and the other end portion of the enclosure adjoin each other;
an insulation member disposed closer to the exhaust pipe than the inner layer portion such that the insulation member is disposed between the exhaust pipe and the inner layer portion, a material of the insulation member being larger in thermal storage degree than a material of the inner layer portion;
a heat generation portion including the thermal insulation member on which the heat generation body is installed;
a metal sheet disposed farther from the exhaust pipe than the inner layer portion such that the metal sheet is interposed between the thermal insulation member and the inner layer portion; and
a temperature sensing part disposed to make contact with the surface of the exhaust pipe, in a gap between the insulation member and the exhaust pipe, at a position closer to the exhaust pipe than the inner layer portion, and formed in a plate shape having a major surface oriented toward the exhaust pipe,
wherein the heat generation body is disposed farther from the exhaust pipe than the inner layer portion such that the inner layer portion is interposed between the temperature sensing part and the heat generation body.

16. The substrate processing apparatus of claim 12, wherein the gas pipe includes a plurality of straight pipe portions formed in a linear shape and a bent portion configured to interconnect the straight pipe portions, and
  wherein the fastening part of the heating part covering the straight pipe portions and the bent portion includes a cover configured to cover one end portion and the other end portion of each of the straight pipe portions, and an auxiliary cover configured to cover the bent portion is installed in the bent portion so that the auxiliary cover is enfolded in the cover.

17. The substrate processing apparatus of claim 16, wherein a sheet configured to increase strength of the cover is installed within the cover.

18. The substrate processing apparatus of claim 17, wherein the auxiliary cover is configured so that the sheet is not installed within the auxiliary cover.

19. The substrate processing apparatus of claim 12, wherein a part of the gas pipe constitutes a flexible pipe formed in a bellows shape, and
  wherein the heating part is configured to cover the flexible pipe, and
  wherein the substrate processing apparatus further comprises an additional temperature sensing part installed on the thermal insulation member in the same manner as the heat generation body, over the flexible pipe.

20. The substrate processing apparatus of claim 19, wherein the additional temperature sensing part is disposed so as not to make contact with the flexible pipe.

21. The substrate processing apparatus of claim 19, wherein the heat generation body is formed using the flexible pipe as a base axis such that a main portion of the heat generation body becomes parallel to a ridge portion and a valley portion of a bellows of the flexible pipe.

22. The substrate processing apparatus of claim 19, wherein the thermal insulation portion of the heating part covering the flexible pipe is formed of a plurality of thermal insulation layers, and each of the thermal insulation layers is cut in a direction perpendicular to a flow direction of a gas flowing through the flexible pipe and divided into a plurality of pieces.

23. The substrate processing apparatus of claim 22, wherein slits extending in the direction perpendicular to the flow direction of the gas flowing through the flexible pipe are formed in each of the thermal insulation layers.

24. The substrate processing apparatus of claim 23, wherein the slits of each of the thermal insulation layers adjoining each other are disposed at staggered positions.

* * * * *